US009752226B2

(12) United States Patent
Tsunekawa

(10) Patent No.: US 9,752,226 B2
(45) Date of Patent: Sep. 5, 2017

(54) MANUFACTURING APPARATUS

(71) Applicant: CANON ANELVA CORPORATION, Kawasaki-shi (JP)

(72) Inventor: Koji Tsunekawa, Kawasaki (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 15/389,259

(22) Filed: Dec. 22, 2016

(65) Prior Publication Data
US 2017/0101708 A1 Apr. 13, 2017

Related U.S. Application Data

(60) Division of application No. 14/488,907, filed on Sep. 17, 2014, now abandoned, which is a continuation of
(Continued)

(30) Foreign Application Priority Data

Dec. 28, 2010 (JP) .................................. 2010-293522

(51) Int. Cl.
*C23C 14/35* (2006.01)
*C23C 14/14* (2006.01)
(Continued)

(52) U.S. Cl.
CPC ............ *C23C 14/14* (2013.01); *C23C 14/067* (2013.01); *C23C 14/081* (2013.01);
(Continued)

(58) Field of Classification Search
CPC ............ H01J 37/3417; H01J 37/32899; C23C 14/3407
See application file for complete search history.

(56) References Cited

U.S. PATENT DOCUMENTS 5,783,055 A 7/1998 Kamei et al.
6,235,634 B1 5/2001 White et al.
(Continued)

FOREIGN PATENT DOCUMENTS

CN 101542767 A 9/2009
CN 101821423 A 9/2010
(Continued)

OTHER PUBLICATIONS

International Search Report in PCT/JP2011/006757, dated Jan. 10, 2012 (4 pages).
(Continued)

*Primary Examiner* — Jason M Berman
(74) *Attorney, Agent, or Firm* — Fitzpatrick, Cella, Harper & Scinto

(57) ABSTRACT

The present invention provides a manufacturing apparatus which can realize so-called sequential substrate transfer and can improve throughput, even when one multi-layered thin film includes plural layers of the same film type. A manufacturing apparatus according to an embodiment of the present invention includes a transfer chamber, three sputtering deposition chambers each including one sputtering cathode, two sputtering deposition chambers each including two or more sputtering cathodes, and a process chamber for performing a process other than sputtering, and the three sputtering deposition chambers, the two sputtering deposition chambers, and the process chamber are arranged around the transfer chamber so that each is able to perform delivery and receipt of the substrate with the transfer chamber.

2 Claims, 7 Drawing Sheets

Related U.S. Application Data application No. 13/919,067, filed on Jun. 17, 2013, now Pat. No. 9,039,873, which is a continuation of application No. PCT/JP2011/006757, filed on Dec. 2, 2011.

(51) Int. Cl.

| | | |
|---|---|---|
| C23C 14/56 | (2006.01) | |
| C23C 14/50 | (2006.01) | |
| C23C 14/34 | (2006.01) | |
| C23C 14/08 | (2006.01) | |
| C23C 14/06 | (2006.01) | |
| H01F 41/18 | (2006.01) | |
| H01J 37/34 | (2006.01) | |
| H01J 37/32 | (2006.01) | |

(52) U.S. Cl.
CPC ........ *C23C 14/345* (2013.01); *C23C 14/3407* (2013.01); *C23C 14/505* (2013.01); *C23C 14/568* (2013.01); *H01F 41/18* (2013.01); *H01J 37/32899* (2013.01); *H01J 37/3417* (2013.01)

(56) References Cited

U.S. PATENT DOCUMENTS

| | | |
|---|---|---|
| 6,641,703 B2 | 11/2003 | Nomura et al. |
| 6,709,767 B2 | 3/2004 | Lin et al. |
| 6,780,524 B2 | 8/2004 | Lin et al. |
| 8,118,981 B2 | 2/2012 | Tsunekawa |
| 8,139,325 B2 | 3/2012 | Tsunekawa et al. |
| 8,377,270 B2 | 2/2013 | Tsunekawa |
| 8,394,649 B2 | 3/2013 | Djayaprawira et al. |
| 2002/0064595 A1 | 5/2002 | Nomura et al. |
| 2003/0030944 A1 | 2/2003 | Lin et al. |
| 2003/0031894 A1 | 2/2003 | Lin et al. |
| 2006/0056115 A1 | 3/2006 | Djayaprawira et al. |
| 2006/0209471 A1 | 9/2006 | Nagasaka et al. |
| 2008/0055793 A1 | 3/2008 | Djayaprawira et al. |
| 2008/0180862 A1 | 7/2008 | Djayaprawira et al. |
| 2010/0033878 A1 | 2/2010 | Tsunekawa et al. |
| 2010/0200394 A1 | 8/2010 | Nagamine et al. |
| 2010/0213047 A1 | 8/2010 | Nagamine et al. |
| 2011/0042209 A1 | 2/2011 | Yamaguchi et al. |
| 2011/0094875 A1 | 4/2011 | Djayaprawira et al. |
| 2011/0139696 A1 | 6/2011 | Fukuyo et al. |
| 2012/0193071 A1 | 8/2012 | Tsunekawa et al. |
| 2013/0105298 A1 | 5/2013 | Tsunekawa et al. |
| 2013/0134032 A1 | 5/2013 | Tsunekawa et al. |
| 2014/0024140 A1 | 1/2014 | Djayaprawira et al. |

FOREIGN PATENT DOCUMENTS

| | | |
|---|---|---|
| JP | H08-239165 A | 9/1996 |
| JP | 2000-269568 A | 9/2000 |
| JP | 2002-167661 A | 6/2002 |
| JP | 2003-158313 A | 5/2003 |
| JP | 2007-311461 A | 11/2007 |
| JP | 2009-044474 A | 4/2009 |
| JP | 2010-126789 A | 6/2010 |
| KR | 10-0441789 B1 | 7/2004 |
| KR | 10-0571104 B1 | 4/2006 |
| TW | 448430 B | 8/2001 |
| TW | 200614556 | 9/2005 |
| TW | 201001458 A1 | 1/2010 |

OTHER PUBLICATIONS

International Preliminary Report on Patentability in PCT/JP2011/006757, dated Jul. 11, 2013 (8 pages).

Office Action issued in Taiwanese Patent Application No. 100148053, dated Mar. 17, 2014 (6 pages).

Korean office action issued in counterpart KR application No. 10-2014-7026103, dated Feb. 6, 2015—5 pages.

Office Action issuded in Chinese Application No. 201180068637.9, dated Nov. 19, 2014 (17 pages).

MANUFACTURING APPARATUS

CROSS-REFERENCES TO RELATED APPLICATIONS

This application is a divisional application of U.S. patent application Ser. No. 14/488,907, filed Sep. 17, 2014, which is a continuation application of U.S. patent application Ser. No. 13/919,067 filed Jun. 17, 2013, which is a continuation of International Application No. PCT/JP2011/006757, filed Dec. 2, 2011, which claims the benefit of Japanese Patent Application No. 2010-293522, filed Dec. 28, 2010. The contents of the aforementioned applications are incorporated herein by reference in their entireties.

TECHNICAL FIELD

The present invention relates to a manufacturing apparatus, and particularly relates to a manufacturing apparatus of a multi-layered thin film which is preferable for a manufacturing process of a device applying a multi-layered thin film, such as a magnetic reproducing head of a magnetic disk drive apparatus, a storage element of a magnetic random access memory, a magneto-resistance element used for a magnetic sensor, a storage element of a semiconductor memory or the like.

BACKGROUND ART

A conventional film-forming apparatus of a multi-layered thin film has a configuration in which one sputtering deposition chamber includes sputtering cathodes in a number equal to or more than the number of film types in a multi-layered thin film (refer to Patent Literature 1), or a configuration of a so-called cluster system including plural sputtering deposition chambers each including plural sputtering cathodes (refer to Patent Literature 2).

In another configuration, a cluster system includes sputtering deposition chambers each including one sputtering cathode, at least in a number equal to the number of film types in a multi-layered thin film (refer to Patent Literature 3).

Further, as still another configuration, there is disclosed a sputtering apparatus for depositing a multi-layered film including a magneto-resistance element over a substrate, using a sputtering apparatus including a first vacuum chamber 110 having one target 116a installed therein, a second vacuum chamber 112 having four targets 116b, 116c, 116d and 116e installed therein, and a transfer chamber 114 coupling these two vacuum chambers 110 and 112, as shown in FIG. 8 (refer to Patent Literature 4).

Further, as still another configuration, there will be explained a sputtering system 600 which is disclosed in Patent Literature 5, by the use of FIG. 9. The sputtering system 600 of FIG. 9 includes a first single-target DC magnetron sputtering module 604, a multi-target DC sputtering module 606, a multi-target ion-beam sputtering module 608, and a second single-target DC magnetron sputtering module 610. A load lock 616 enables ingress and egress of a wafer. A control panel 614 controls a parameter and process of the sputtering system 600.

First, by the use of FIG. 10, there will be explained a spin valve sensor 300 which is fabricated by the use of the sputtering system 600 described in FIG. 9. The spin valve sensor 300 described in FIG. 10 includes a substrate 302, a bottom shield layer 311 (Ni—Fe film), a bottom gap layer 304 ($Al_2O_3$ film), multiple seed layers 306 (first seed layer: $Al_2O_3$ film, second seed layer: Ni—Cr—Fe film, and third seed layer: Ni—Fe film), an anti-ferromagnetic pinning layer 308 (Pt—Mn film), a Co—Fe film 310, a Ru film 312, a Co—Fe film 314, a spacer layer 316 (Cu (Cu—O) film), a Co—Fe film 318, a Ni—Fe film 320, a cap layer 322 (Al (Al—O) film), an upper gap layer 324 ($Al_2O_3$ film), and an upper shield layer (Ni—Fe film) 325. Here, FIG. 10 shows that a ferromagnetism sensing layer 307 (called "free layer") is separated from a ferromagnetic pinned layer 309 by the spacer layer 316. In the spin valve sensor 300 shown in FIG. 10, magnetization of the pinned layer 309 is confined by exchange coupling with an anti-ferromagnetic film called a pinning layer, and magnetization of another ferromagnetic film called a "sensing" layer or a "free" layer 307 is not fixed and rotates freely in response to a magnetic field (signal magnetic field) from a recorded magnetic medium.

Next, by the use of the sputtering system 600 described in FIG. 9, there will be explained a method of fabricating the spin valve sensor 300. First, the bottom gap layer 304 is formed over a wafer in the first single-target DC magnetron sputtering module 604. After that, for stacking the multiple seed layers 306, the wafer is transferred into the second single-target DC magnetron sputtering module 610, and the first seed layer $Al_2O_3$ film is stacked. After that, for stacking the second seed layer Ni—Fe—Cr film and the third seed layer Ni—Fe film, the wafer is transferred into the multi-target ion-beam sputtering module 608 and the Ni—Cr—Fe film and the Ni—Fe film are stacked respectively. After that, the wafer is transferred into the multi-target DC magnetron sputtering module 606 for stacking the remaining layers of the spin valve sensor. The remaining layers include the Pt—Mn film 308, the Co—Fe film 310, the Ru film 312, the Co—Fe film 314, the Cu (Cu—O) film 316, the Co—Fe film 318, the Ni—Fe film 320, and the Al (Al—O) film 322. After stacking thereof, the wafer is annealed and a Ta film is stacked.

CITATION LIST

Patent Literature

PTL 1: Japanese Patent Application Laid-Open No. 2002-167661

PTL 2: Japanese Patent Application Laid-Open No. H08-239765

PTL 3: Japanese Patent Application Laid-Open No. 2007-311461

PTL 4: Japanese Patent Application Laid-Open No. 2000-269568

PTL 5: Japanese Patent Application Laid-Open No. 2003-158313

SUMMARY OF INVENTION

In a recent multi-layered thin film application device, in addition to increase in the number of stacked layers, there is a trend of using film thicknesses different in an order of magnitude among films forming a multi-layered thin film, and combining a metal film, an insulating film, and a semiconductor film.

In a case of forming such a multi-layered thin film by a cluster-type manufacturing apparatus which includes plural sputtering deposition chambers each including plural sputtering cathodes (Patent Literature 1 and Patent Literature 2), a time for sputter-forming a film having a thickness thicker in a different order of magnitude or for an oxide film having a sputtering rate lower in a different order of magnitude in the multi-layered thin film becomes longer than a time for forming another thin film, and this has been a cause of limiting throughput of a manufacturing apparatus. In particular, when forming a film including a single element, there has been a problem also in a footprint because only one of plural sputtering cathodes functions.

Further, for a case of a multi-layered thin film formed by combining a metal film, an insulating film, and a semiconductor film using the manufacturing apparatus described in Patent Literature 1 or Patent Literature 2, there has been a problem of so-called interlayer cross contamination that device characteristics are degraded considerably when the metal film is mixed into the insulating film or the semiconductor film.

On the other side, in the cluster-type manufacturing apparatus including the sputtering deposition chambers each including one sputtering cathode, at least in a number equal to the number of film types in a multi-layered thin film (Patent Literature 3), the interlayer cross contamination can be avoided. However, since the number of sputtering deposition chambers needs to be increased, the size of a manufacturing apparatus is increased, and therefore there has been a problem of cost increase, footprint increase, and energy consumption increase. Further, in the manufacturing apparatus described in Patent Literature 3, there has been a problem that a film containing plural elements cannot be formed.

Moreover, in the sputtering apparatus described in Patent Literature 4, when one multi-layered thin film includes plural layers of the same film type, a substrate is transferred twice to the same process chamber in a series of film deposition processes because a sputtering target is not provided for each layer. That is, when a magneto-resistance effect film including Ta/NiFe/CoFeB/Cu/CoFeB/PdPtMn/Ta is formed by the use of the sputtering apparatus which is described in Patent Literature 4 and shown in FIG. 8, a substrate is transferred twice to the first vacuum chamber 110 as follows. First, a Ta film is formed on a substrate surface by sputtering using Ta as a target in the first vacuum chamber 110, the substrate is transferred into the second vacuum chamber 112, and then a NiFe film, a CoFeB film, a Cu film, a PdPtMn film are formed by sputtering using NiFe, CoFeB, Cu, PdPtMn as targets. After that, the substrate needs to be transferred into the first vacuum chamber 110 again for the purpose of forming a Ta film on the substrate surface by sputtering using Ta as a target in the first vacuum chamber 110. In this manner, for the case of the sputtering apparatus described in Patent Literature 4, a substrate is transferred into the same process chamber twice in a series of the film deposition processes and therefore there has been a problem in throughput. Moreover, there has been a problem that so-called sequential substrate transfer cannot be realized.

Further, in the sputtering system 600 of Patent Literature 5 shown in FIG. 9, a wafer is transferred into the first single-target DC magnetron sputtering module 604, the second single-target DC magnetron sputtering module 610, the multi-target ion-beam sputtering module 608, and the multi-target DC sputtering module 606, in this order, and the spin valve sensor 300 described in FIG. 11 is fabricated. Accordingly, the sputtering system 600 of Patent Literature 5 realizes so-called sequential substrate transfer, compared to the sputtering apparatus described in Patent Literature 4.

In the sputtering system 600 of Patent Literature 5, however, film depositions from the anti-ferromagnetism pinning layer 308 (Pt—Mn film) to the cap layer 322 (Al (Al—O) film) in the spin valve sensor 300 are performed in the multi-target DC sputtering module 606.

Typically, in the spin valve sensor 300, the film thickness (10 to 20 nm) of the anti-ferromagnetic pinning layer 308 (Pt—Mn film) is one order larger than the film thicknesses of other layers, for example, the Co—Fe film 318 (1 to 5 nm). Accordingly, a film deposition time (also called "takt time") in the multi-target DC sputtering module 606 is considerably long compared to film deposition times in the first single-target DC magnetron sputtering module 604, the second single-target DC magnetron sputtering module 610, and the multi-target ion-beam sputtering module 608. Throughput is determined by a substrate work quantity which can be processed in a unit time (takt time). Accordingly, even when the takt time is short in each of the first single-target DC magnetron sputtering module 604, the second single-target DC magnetron sputtering module 610, and the multi-target ion-beam sputtering module 608, the throughput is determined by the takt time of the multi-target DC sputtering module 606 if the takt time of the multi-target DC sputtering module 606 is longer. As a result, the sputtering system 600 of Patent Literature 5 still has a problem in the throughput.

The present invention aims at providing a manufacturing apparatus which can realize so-called sequential substrate transfer and improve throughput even when one multi-layered thin film includes plural layers of the same film type.

For achieving such a purpose, one aspect of the present invention is a manufacturing apparatus that grows a multi-layered film over a substrate, and includes: a transfer chamber including a substrate transfer mechanism; a first sputtering deposition chamber including one sputtering cathode; a second sputtering deposition chamber including one sputtering cathode; a third sputtering deposition chamber including one sputtering cathode; a fourth sputtering deposition chamber including two or more sputtering cathodes; a fifth sputtering deposition chamber including two or more sputtering cathodes; and a process chamber for performing a process other than sputtering, wherein the first sputtering deposition chamber, the second sputtering deposition chamber, the third sputtering deposition chamber, the fourth sputtering deposition chamber, the fifth sputtering deposition chamber, and the process chamber are arranged around the transfer chamber so that each is able to perform delivery and receipt of the substrate with the transfer chamber.

According to the present invention, the first sputtering deposition chamber including one sputtering cathode, the second sputtering deposition chamber including one sputtering cathode, the third sputtering deposition chamber including one sputtering cathode, the fourth sputtering deposition chamber including two or more sputtering cathodes, the fifth sputtering deposition chamber including two or more sputtering cathodes, and the process chamber for performing a process other than sputtering are arranged around the transfer chamber. Accordingly, even when one multi-layered thin film includes plural layers of the same film type, it is possible to realize so-called sequential substrate transfer and to improve throughput.

DESCRIPTION OF EMBODIMENTS

There will be explained a multi-layered film manufacturing apparatus according to an embodiment of the present invention by the use of the drawings.

Figure 1:
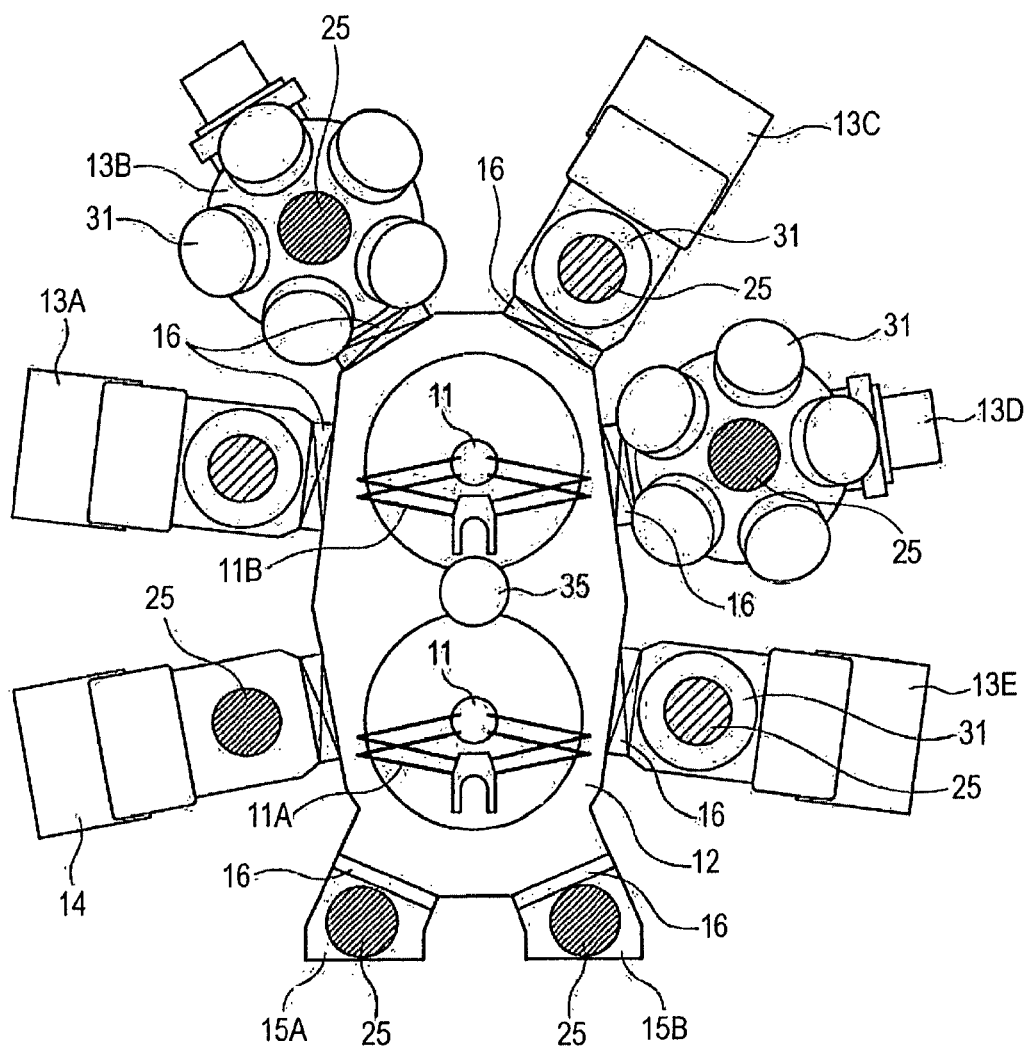
FIG. 1 is a configuration diagram showing a first example of a multi-layered thin film manufacturing apparatus according to an embodiment of the present invention.

FIG. 1 is a configuration diagram showing a first example of a multi-layered thin film manufacturing apparatus according to an embodiment of the present invention. The manufacturing apparatus of FIG. 1 is suitable to improve throughput while maintaining a low cost, and further to suppress device characteristic degradation by preventing or reducing interlayer cross contamination, in forming a multi-layered thin film.

A feature of the manufacturing apparatus of the present invention is that a process chamber for performing a process other than sputtering (etching chamber 14), a first sputtering deposition chamber including one sputtering cathode (sputtering deposition chamber 13A), a second sputtering deposition chamber including one sputtering cathode (sputtering deposition chamber 13C), a third sputtering deposition chamber including one sputtering cathode (sputtering deposition chamber 13E), a fourth sputtering deposition chamber including two or more sputtering cathodes (sputtering deposition chamber 13B), and a fifth sputtering deposition chamber including two or more sputtering cathodes (sputtering deposition chamber 13D) are arranged around a transfer chamber including a substrate transfer mechanism. Here, in FIG. 1, the three sputtering deposition chambers each including one sputtering cathode, the two sputtering deposition chambers each including two or more sputtering cathodes, and the process chamber for performing a process other than sputtering are provided around the transfer chamber including the substrate transfer mechanism. As will be described below, it is necessary to provide three or more sputtering deposition chambers each including one sputtering cathode, from the viewpoint of throughput improvement.

In FIG. 1, the five sputtering deposition chambers 13A to 13E, the etching chamber 14 for removing oxide and contamination on a substrate 25 surface by reverse sputtering etching, and two load lock chambers 15A and 15B are connected to the transfer chamber 12 which includes two substrate transfer robots 11A and 11B as the substrate transfer mechanism 11. Among the sputtering deposition chambers 13A to 13E, each of 13A, 13C and 13E includes one sputtering cathode 31, and each of 13B and 13D includes five sputtering cathodes 31. Note that one substrate transfer robot may be used as the substrate transfer mechanism 11 described in FIG. 1.

Each of all the above chambers and the load lock chambers 15A and 15B preferably has a vacuum pump for exhausting the chamber into vacuum, and the chambers other than the load lock chambers 15A and 15B are always maintained in vacuum. Here, in all the embodiments to be described below, all the chambers and the load lock chambers are assumed to have vacuum pumps.

The load lock chambers 15A and 15B are maintained to have the same pressure as an atmospheric pressure when the substrate 25 is brought in from atmospheric air before process and when the substrate 25 is taken out to atmospheric air after the process. On the other side, the load lock chambers 15A and 15B are exhausted into vacuum when the substrates 25 disposed in the load lock chambers 15A and 15B are transferred into the transfer chamber 12 which is exhausted into vacuum and when the substrate 25 is retrieved from the transfer chamber 12 after the process. The number of load lock chambers 15A and 15B may not necessarily be two and may be one.

Gate valves 16 are provided between each of the sputtering deposition chamber 13A, the sputtering deposition chamber 13B, the sputtering deposition chamber 13C, the sputtering deposition chamber 13D, the sputtering deposition chamber 13E, and the process chamber 14, and each of the load lock chambers 15a and 15B. Each of the gate valves 16 is closed except when the substrate 25 is transferred. The substrate transfer robot 11 is configured to take out the substrate 25 from the load lock chamber 15A or 15B and transfer the substrate 25 into a desired chamber by an instruction from computer program.

Figure 2:
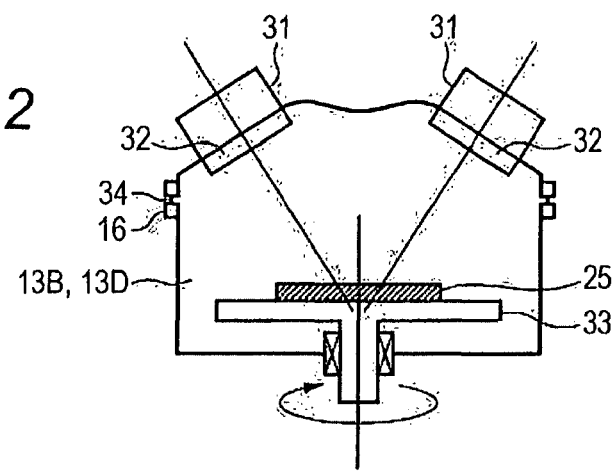
FIG. 2 is a configuration diagram showing an example of a sputtering deposition chamber including plural sputtering cathodes according to an embodiment of the present invention.

In the sputtering deposition chamber 13B and the sputtering deposition chamber 13D each including the plural sputtering cathodes 31, the plural sputtering cathodes 31 are disposed in each upper part of the sputtering deposition chambers 13B and 13D as shown in FIG. 2. In each inside lower part of the sputtering deposition chambers 13B and 13D, a substrate stage 33 is provided which is rotatable by a power source (not shown in the drawing) provided outside the sputtering deposition chambers 13B and 13D. The substrate 25 for thin film deposition is placed over the substrate stage 33 at least during film deposition. Each of the sputtering cathodes 31 includes a sputtering target 32 which is made of a material corresponding to the film type of each layer forming a multi-layered thin film, and disposed at an angle so that the surface of the sputtering target 32 faces substantially in the center direction of the substrate stage 33 in FIG. 2. Note that the sputtering cathode 31 is not necessarily disposed at an angle and may be disposed so that the surface of the sputtering target 32 is substantially in parallel to the substrate 25 surface.

When a thin film is formed in this deposition chamber, DC or RF power is applied to a desired sputtering cathode 31 preferably while the substrate stage 33 is being rotated, and the power is shut down when a desired film thickness is reached. A shutter may be disposed between the substrate 25 and the sputtering target 32, and the film thickness may be controlled by open and close of the shutter while the power is being applied. When a multi-layered thin film is formed, the above film forming operation may be performed sequentially while the substrate is placed on the rotating substrate stage 33. Here, in FIG. 1, four kinds of target 31 are disposed in the sputtering deposition chamber 13B and the materials thereof are PtMn, CoFe, Ru, and CoFeB. Further, the gate valve 16 is provided on the side wall of the sputtering deposition chamber 13B via an O ring 34. Further, four kinds of target 31 are disposed in the sputtering deposition chamber 13D and the materials thereof are PtMn, CoFe, Ru, and CoFeB. Further, the gate valve 16 is provided on the side wall of the vacuum chamber 13A via an O ring 34.

Figure 3:
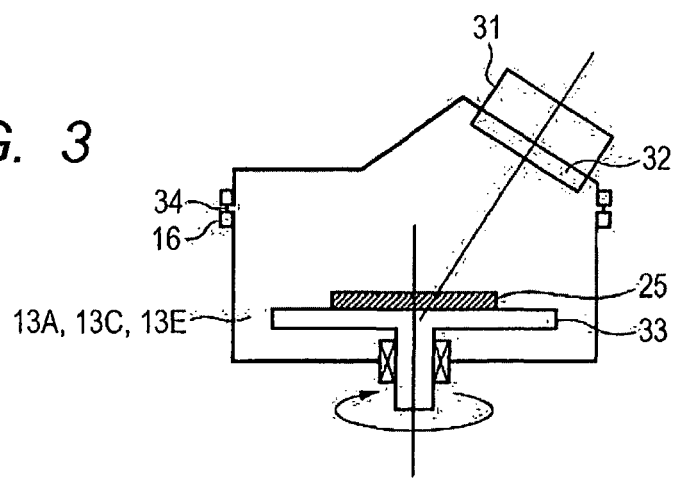
FIG. 3 is a configuration diagram showing an example of a sputtering deposition chamber including one sputtering cathode according to an embodiment of the present invention.
Figure 4:
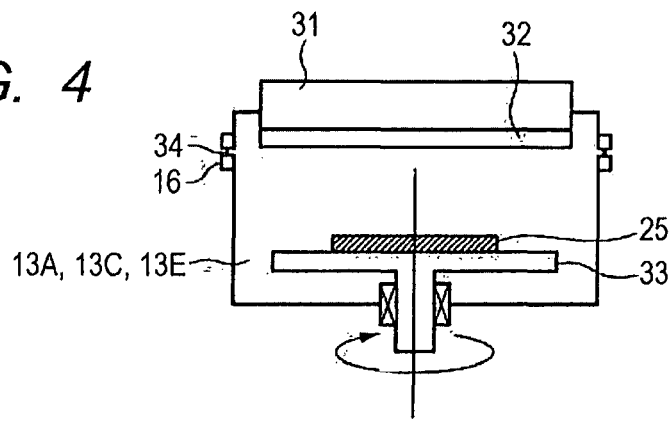
FIG. 4 is a configuration diagram showing an example of a sputtering deposition chamber which mounts a sputtering cathode so as to make a sputtering target surface substantially parallel to a substrate surface according to an embodiment of the present invention.

In the sputtering deposition chambers 13A, 13C and 13E each including one sputtering cathode 31, as shown in FIG. 3, one sputtering cathode may be only disposed in the sputtering deposition chamber including plural sputtering cathodes and the same film forming operation may be performed. Preferably, the sputtering cathode is placed to have a size larger than that of the sputtering cathode placed on the sputtering deposition chamber including the plural sputtering cathodes in order to obtain a higher film deposition rate. Alternatively, as shown in FIG. 4, the sputtering cathode may be placed so that the surface of the sputtering target is substantially in parallel to the substrate surface. In this case, the substrate stage needs not be rotated in particular. Here, in FIG. 1, one kind of target 32 is disposed in the sputtering deposition Chamber 13A and the material thereof is a material capable of forming an oxide film, a nitride film, or a semiconductor film. Further, one kind of target 32 is disposed in the sputtering deposition chamber 13C and the material thereof is a material capable of forming a metal film having a thickness not smaller than 10 nm. Further, one kind of target 32 is disposed in the sputtering deposition chamber 13E and the material thereof is a material capable of forming a metal film having a thickness not smaller than 10 nm. Note that, in FIG. 1, a target formed by a material capable of forming a metal film having a thickness not smaller than 10 nm may be disposed in the sputtering deposition chamber 13A and a target formed by a material capable of forming an oxide film, a nitride film, or a semiconductor film may be disposed in either the sputtering deposition chamber 13C or the sputtering deposition chamber 13E. That is, in at least one of the sputtering deposition chambers 13A, 13C and 13E each including one sputtering cathode, a film having a thickness larger than those of the other films (e.g., not smaller than 10 nm) may be formed.

The process chamber 14 which performs a process other than sputtering deposition is connected to the transfer chamber 12. As the process chamber 14, there can be employed a process chamber for removing a thin film formed on or over the substrate, with plasma, an ion beam, an atom beam, a molecular beam, and a gas Cluster beam. For other examples, as the process chamber 14, there may be employed a process chamber for forming a thin film on the thin film formed on or over the substrate, by a chemical vapor deposition method, a process chamber for causing the thin film formed on or over the substrate to chemically react in gas, neutral active species, ions, or a mixed atmosphere thereof, or a process chamber for heating, cooling, or heating and cooling the substrate.

Figure 7:
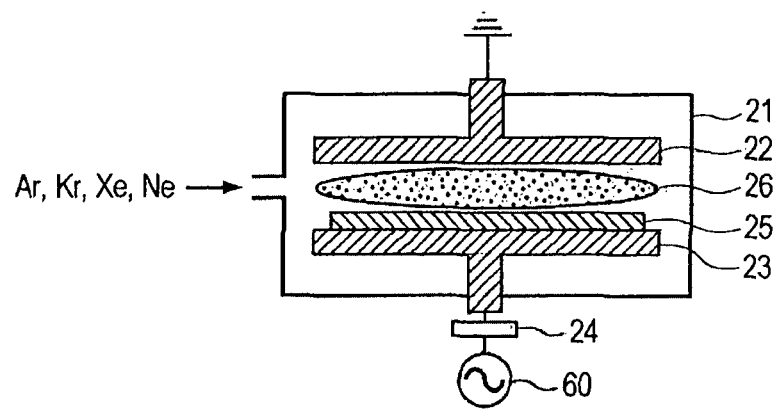
FIG. 7 is a configuration diagram showing an internal structure of a process chamber which can be applied to an embodiment of the present invention.
Figure 8:
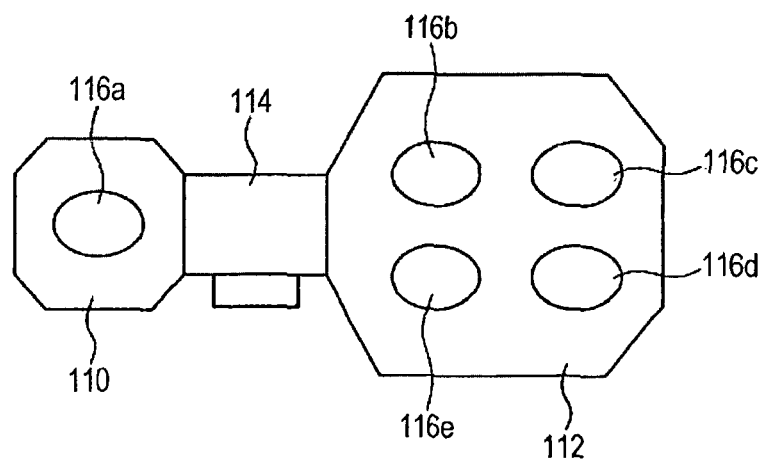
FIG. 8 is a configuration diagram showing an example of a conventional multi-layered thin film manufacturing apparatus (Patent Literature 4).
Figure 9:
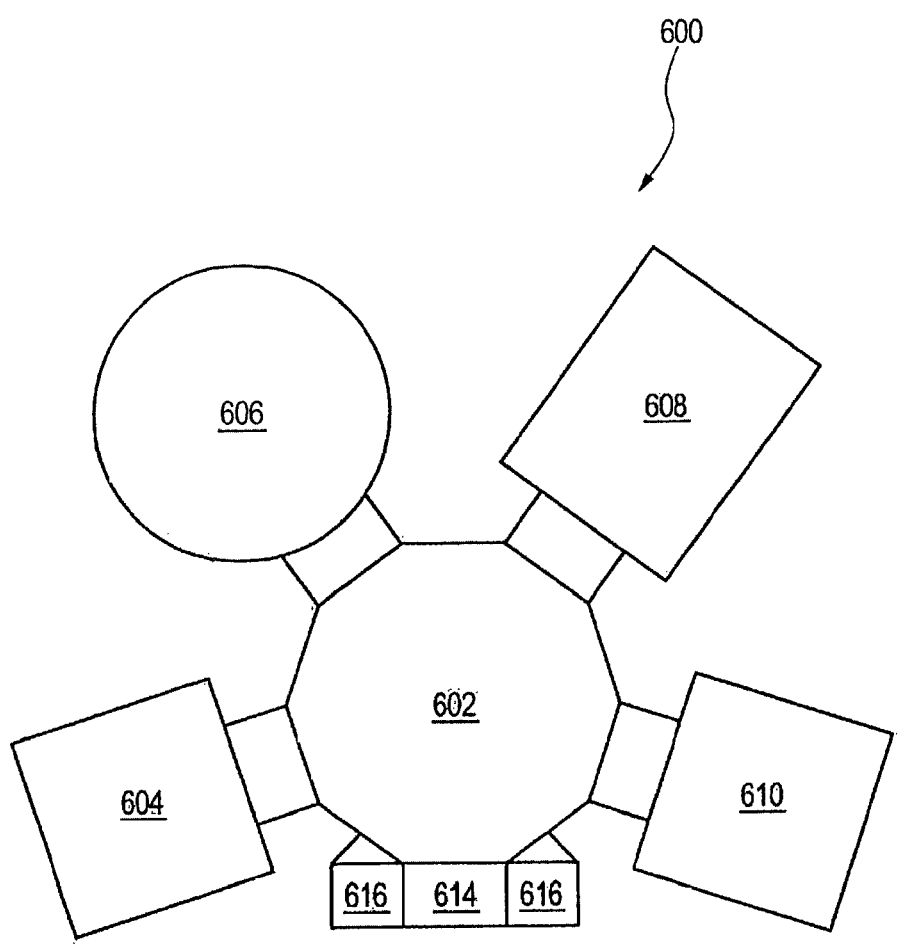
FIG. 9 is a configuration diagram showing an example of a conventional multi-layered thin film manufacturing apparatus (Patent Literature 5).
Figure 10:
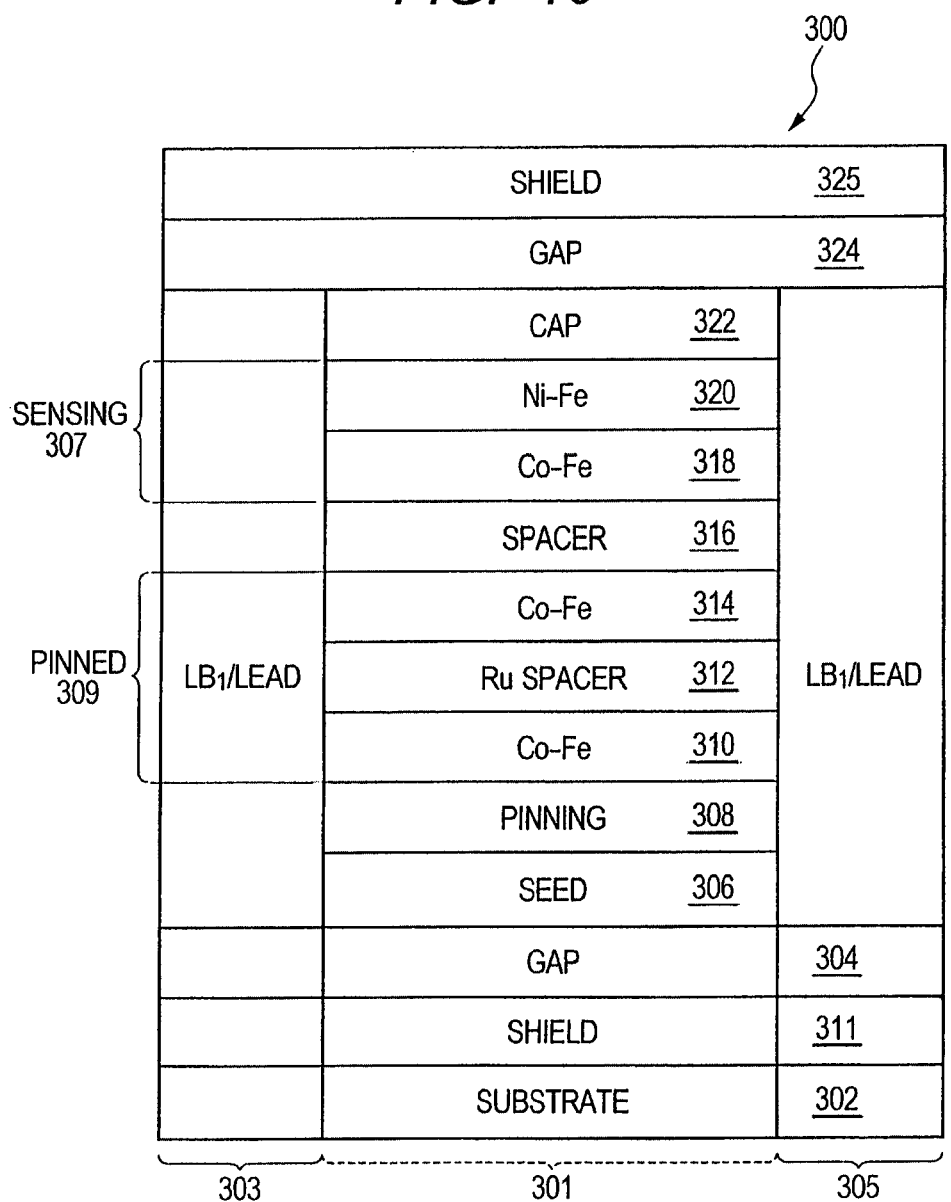
FIG. 10 is a configuration diagram showing an example of a spin valve sensor which is fabricated by a conventional multi-layered thin film manufacturing apparatus (Patent Literature 5).

An internal structure of the process chamber 14 is shown in FIG. 7. The process chamber 14 includes a vacuum chamber 21, and an upper electrode 22 and a lower electrode are provided in this vacuum chamber 21. The upper electrode 22 is earthed and the lower electrode 23 is connected to an RF power source (high frequency power source) 60 via a matching box 24. A substrate 25 is placed on the lower electrode 23. Plasma 26 is generated between the upper electrode 22 and the lower electrode 23 when a plasma generation condition is established.

As a representative example of processing operation in the above process chamber 14, Ar gas of 0.075 Pa is introduced into the inside of the vacuum chamber 21, RF power of 15 W (0.029 W/cm$^2$ for a unit area) is applied to the lower electrode 23 to generate the plasma 26, and plasma processing is further performed under a condition that a substrate bias voltage (Vdc) is a voltage included in a range smaller than 0 V and not smaller than −300 V. The upper limit value of the substrate bias voltage is preferably −2 to −3 V, and the most preferable voltage is a voltage included in a range from −15 V to the upper limit value of the substrate bias voltage. This voltage is a voltage capable of generating plasma. For the process gas to be introduced into the vacuum chamber 21, inert gas such as Kr, Xe, Ne or similar gas can be used instead of Ar. Process gas pressure in the process chamber 14 is set to be a low pressure in a range of 0.01 to 100 Pa.

Next, there will be explained embodiments of the present invention by the use of the drawings.

(First Embodiment)

Figure 5:
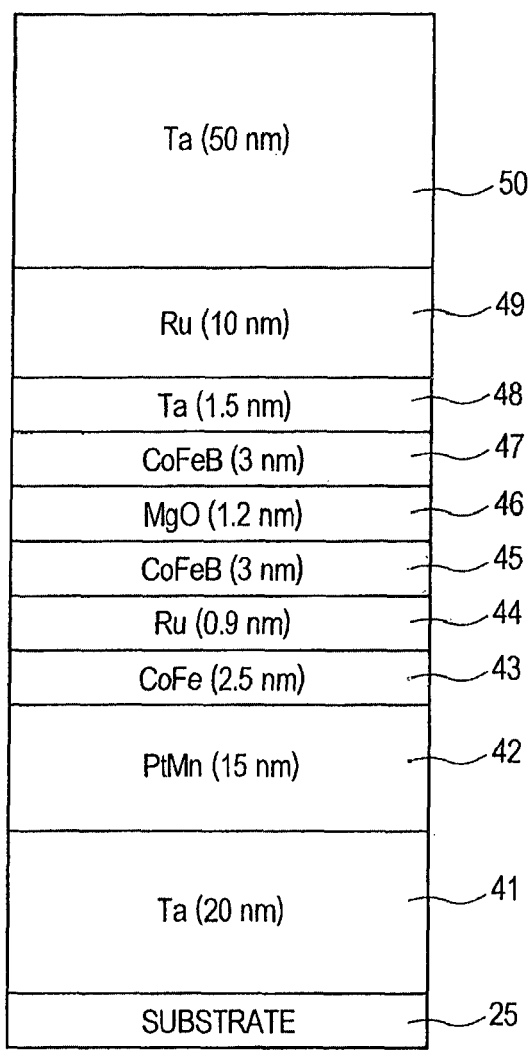
FIG. 5 is a film composition diagram of a tunnel magnetoresistance element which is fabricated by the use of a manufacturing apparatus according to an embodiment of the present invention.

FIG. 5 is a film composition diagram of a tunnel magneto-resistance element (magneto-resistance multi-layered film) fabricated by the use of a manufacturing apparatus according to an embodiment of the present invention. On a substrate 25, there is formed a stacked body including a Ta layer 41, a PtMn layer 42, a CoFe layer 43, a Ru layer 44, a CoFeB layer 45, an MgO layer 46, a CoFeB layer 47, a Ta layer 48, a Ru layer 49, and a Ta layer 50. That is, over the substrate 25, the Ta layer 41 is formed having a film thickness of 20 nm as a foundation layer, successively the PtMn layer 42 of anti-ferromagnetic material is formed having a film thickness of 15 nm, successively the CoFe layer 43 of ferromagnetic material is formed having a film thickness of 2.5 nm, the Ru layer 44 of non-magnetic material is formed having a film thickness of 0.9 nm, the CoFeB layer 45 of ferromagnetic material is formed having a film thickness of 3 nm, and the MgO layer 46 of oxide is formed having a film thickness of 1.2 nm. Successively, the CoFeB layer 47 of ferromagnetic material is formed again having a film thickness of 3 nm, the Ta layer 48 is formed thereover having a very small film thickness of 1.5 nm, and then the Ru layer 49 and the Ta layer 50 are formed having film thickness of 10 nm and a film thickness of 50 nm, respectively. The bottom Ta film and the top Ta film 50 have outstandingly large thicknesses and secondarily the PtMn layer 42 and the upper Ru layer 49 have large thicknesses. On the other side, for the CoFe layer 43 to the middle Ta layer 47, thin layers are stacked having film thicknesses not larger than 3 nm per one layer. Further, only the MgO layer 46 is oxide. In FIG. 5, the Ta layer 41 functions as a foundation layer, the PtMn layer 42 functions as an anti-ferromagnetic layer, a stacked layer of the ferromagnetic CoFe layer 43, the non-magnetic Ru layer 44, and the ferromagnetic CoFeB layer 45 functions as a magnetization fixing layer, the MgO layer 46 functions as a non-magnetic insulating layer, the CoFeB layer 47 functions as a magnetization free layer, and a stacked layer of the Ta layer 48, the Ru layer 49, and the Ta layer 50 functions as a protection layer.

FIG. 1 shows a manufacturing apparatus suitable to improve throughput while maintaining a low cost and further to suppress device characteristic degradation by preventing or reducing the interlayer cross contamination, in the deposition of such a multi-layered thin film.

As described above, in FIG. 1, the three sputtering deposition chambers each including one sputtering cathode, the two sputtering deposition chambers each including two or more sputtering cathodes and the one process chamber for performing a process other than sputtering are provided around the transfer chamber including the substrate transfer mechanism. As will be described below, at least three sputtering deposition chambers each including one sputtering cathode and at least two sputtering deposition chambers each including two or more sputtering cathodes are necessary from the viewpoint of throughput improvement.

When the tunnel magneto-resistance element (magneto-resistance multi-layered film) described in FIG. 5 is manufactured by the use of the apparatus of FIG. 1, a Ta target 32 is attached to each of the sputtering deposition chambers 13A and 13E and used for forming the bottom Ta film 41 and the top Ta film 47 each shown in FIG. 5. Four sputtering targets 32 of PtMn, CoFe, Ru and CoFeB are attached to the sputtering deposition chamber 13B and the remaining one sputtering cathode 31 is left vacant for backup. An MgO sintered target 32 is attached to the sputtering deposition chamber 13C. Three targets 32 of CoFeB, Ta and Ru are attached to the sputtering deposition chamber 13D, and the remaining two sputtering cathodes 31 are left vacant for backup.

The reason why the sputtering target 32 is disposed for each layer although one multi-layered thin film includes plural layers of the same film type is to realize so-called sequential substrate transfer in which the substrate 25 is not transferred twice to the same process chamber in a series of the film deposition processes. That is, when plural layers of the same type are formed in different thicknesses, thinner one is formed by at least one of the three sputtering deposition chambers each including one sputtering cathode and thicker one is formed by another deposition chamber of the three sputtering deposition chambers. Accordingly, layers which are the same type but have different thicknesses can be formed without the substrate being transferred twice to the same sputtering deposition chamber. When such sequential substrate 25 transfer is realized, process time bars of respective substrates 25 can be overlapped in a process time bar graph for continuous processing of the plural substrates 25 and therefore throughput is improved greatly. The gate valves 16 are provided between each of the sputtering deposition chamber 13A to the sputtering deposition chamber 13E, and the etching chamber 14, and each of the load lock chambers 15A and 15B. Here, reference numeral 35 indicates a placement stage for placing the substrate 25 temporarily when the two substrate transfer robots 11A and 11B receive and deliver the substrate 25, and a position alignment mechanism of the substrate 25 and a notch alignment mechanism of the substrate 25 may be provided separately.

Following Table 1 shows a process time table in the apparatus configuration of FIG. 1.

TABLE 1

| Process | Chamber | Event | Process time | Takt time [sec] |
|---|---|---|---|---|
| 1 | Transfer chamber12 | Wafer Transfer | 10.0 | 10.0 |
| 2 | Etching chamber14 | Etching | 80.0 | 80.0 |
| 3 | Transfer chamber12 | Wafer Transfer | 10.0 | 10.0 |
| 4 | Sputtering deposition chamber A (1PVD)13A | Ta deposition | 40.0 | 40.0 |
| 5 | Transfer chamber12 | Wafer Transfer | 10.0 | 10.0 |
| 6 | Sputtering deposition chamber B (5PVD)13B | PtMn deposition | 80.0 | 180.0 |
|  |  | CoFe deposition | 25.0 |  |
|  |  | Ru deposition | 25.0 |  |
|  |  | CoFeB deposition | 50.0 |  |
| 7 | Transfer chamber12 | Wafer Transfer | 10.0 | 10.0 |
| 8 | Sputtering deposition chamber C (1PVD)13C | MgO deposition | 60.0 | 60.0 |
| 9 | Transfer chamber12 | Wafer Transfer | 10.0 | 10.0 |
| 10 | Sputtering deposition chamber D (5PVD)13D | CoFeB deposition | 50.0 | 145.0 |
|  |  | Ta deposition | 25.0 |  |
|  |  | Ru deposition | 70.0 |  |
| 11 | Transfer chamber12 | Wafer Transfer | 10.0 | 10.0 |
| 12 | Sputtering deposition chamber E (1PVD)13E | Ta deposition | 100.0 | 100.0 |
| 13 | Transfer chamber12 | Wafer Transfer | 10.0 | 10.0 |
|  | Total time |  | 675.0 | 675.0 |

Throughput = 20.0

Along the process time table of Table 1, there will be explained a film forming sequence of the tunnel magneto-resistance element described in FIG. 5. An unprocessed substrate 25 is transferred into the etching chamber 14 from the load lock chamber 15A by the use of the substrate transfer robot 11A (process 1 of Table 1), oxide and contamination on the substrate 25 surface are removed by reverse sputtering etching in the etching chamber 14 (process 2 of Table 1). Next, the substrate 25 is placed on the placement stage 35 within the transfer chamber 12 by the substrate transfer robot 11A (process 3 of Table 1). Next, the substrate 25 is transferred into the sputtering deposition chamber 13A by the substrate transfer robot 11B and a Ta layer having a film thickness of 20 nm is deposited over the substrate 25 as a foundation layer (process 4 of Table 1). Next, the substrate 25 on which the Ta layer is deposited is transferred into the sputtering deposition chamber 13B by the substrate transfer robot 11B (process 5 of Table 1), and, over the substrate 25, a PtMn layer 42 of anti-ferromagnetic material is deposited in 15 nm, and successively a CoFe layer 43 of ferromagnetic material is deposited in 2.5 nm, a Ru layer 44 of non-magnetic material is deposited in 0.9 nm, and a CoFeB layer 45 of ferromagnetic material is deposited in 3 nm (process 6 of Table 1). Next, the substrate 25 is transferred into the sputtering deposition chamber 13C by the substrate transfer robot 11B (process 7 of Table 1) and an MgO layer 46 of oxide is deposited in 1.2 nm (process 8 of Table 1). Next, the substrate 25 is transferred into the sputtering deposition chamber 13D by the substrate transfer robot 11B (process 9 of Table 1), a CoFeB layer 47 is deposited again over the substrate 25 in 3 nm and a Ta layer 48 is deposited thereover in a very small thickness of 1.5 nm, and then a Ru layer 49 of 10 nm and the Ta layer 50 of 50 nm are deposited (process 10 of Table 1). Next, the substrate 25 is transferred into the sputtering deposition chamber 13G by the substrate transfer robot 11B (process 11 of Table 1), a Ta layer 50 of 50 nm is deposited (process 12 of Table 1). Next, the substrate 25 is transferred into the load lock chamber 15B by the substrate transfer robot 11A (process 13 of Table 1).

As shown in the process time table of FIG. 1, the process chamber requiring the longest takt time is the sputtering deposition chamber 13B and the takt time is 180 seconds. Throughput is limited by this takt time and a derived throughput is 20 wafers/hour. Here, in the present specification, "takt time" means a time after a substrate has been transferred into some chamber until the substrate is transferred out of the some chamber after processing. Further, in the present specification, throughput means substrate work volume which can be processed within a unit time.

As described above, each of the sputtering deposition chamber 13B and the sputtering deposition chamber 13D has the sputtering cathode 31 for backup, and, therefore, targets of PtMn and Ru can be attached to the cathodes 31 of the chambers 13B and 13D, respectively, and a co-sputtering method of discharging the two sputtering cathodes 31 at the same time can be utilized. Thereby, a film deposition rate is increased twice and it is possible to reduce deposition time to one half for PtMn in process 6 of Table 1 and for Ru in process 10 of Table 1.

TABLE 2

| Process | Chamber | Event | Process time | [sec] Takt time |
|---|---|---|---|---|
| 1 | Transfer chamber12 | Wafer Transfer | 10.0 | 10.0 |
| 2 | Etching chamber14 | Etching | 80.0 | 80.0 |
| 3 | Transfer chamber12 | Wafer Transfer | 10.0 | 10.0 |
| 4 | Sputtering deposition chamber A (1PVD)13A | Ta deposition | 40.0 | 40.0 |
| 5 | Transfer chamber12 | Wafer Transfer | 10.0 | 10.0 |
| 6 | Sputtering deposition chamber B (5PVD)13B | PtMn deposition* | 40.0 | 140.0 |
|  |  | CoFe deposition | 25.0 |  |
|  |  | Ru deposition | 25.0 |  |
|  |  | CoFeB deposition | 50.0 |  |
| 7 | Transfer chamber12 | Wafer Transfer | 10.0 | 10.0 |
| 8 | Sputtering deposition chamber C (1PVD)13C | MgO deposition | 60.0 | 60.0 |
| 9 | Transfer chamber12 | Wafer Transfer | 10.0 | 10.0 |
| 10 | Sputtering deposition chamber D (5PVD)13D | CoFeB deposition | 50.0 | 110.0 |
|  |  | Ta deposition | 25.0 |  |
|  |  | Ru deposition* | 35.0 |  |
| 11 | Transfer chamber12 | Wafer Transfer | 10.0 | 10.0 |
| 12 | Sputtering deposition chamber E (1PVD)13E | Ta deposition | 100.0 | 100.0 |
| 13 | Transfer chamber12 | Wafer Transfer | 10.0 | 10.0 |
|  |  | Total time | 600.0 | 600.0 |

*co-sputtering
Throughput = 25.7

The process time table in this case is specified by process 6 and process 10 of above Table 2, and the takt time for the sputtering deposition chamber 13B is reduced from 180 seconds to 140 seconds and the takt time for the sputtering deposition chamber 13D is reduced from 145 seconds to 110 seconds, although the sputtering deposition chamber 13B still limits the takt times. Accordingly, the throughput is improved to 25.7 wafers/hour.

As a comparative example, Table 3 shows a time table when the tunnel magneto-resistance element described in FIG. 5 is formed by the use of the sputtering apparatus described in Patent Literature 1.

TABLE 3

| Process | Chamber | Event | Process time | [sec] Takt time |
|---|---|---|---|---|
| 1 | Transfer chamber | Wafer Transfer | 10.0 | 10.0 |
| 2 | Etching chamber | Etching | 80.0 | 80.0 |
| 3 | Transfer chamber | Wafer Transfer | 10.0 | 10.0 |

TABLE 3-continued

| Process | Chamber | Event | Process time | [sec] Takt time |
|---|---|---|---|---|
| 4 | Sputtering deposition chamber A (4PVD) | Ta deposition* | 60.0 | 100.0 |
|  |  | PtMn deposition* | 40.0 |  |
| 5 | Transfer chamber | Wafer Transfer | 10.0 | 10.0 |
| 6 | Sputtering deposition chamber B (4PVD) | CoFe deposition | 25.0 | 125.0 |
|  |  | Ru deposition | 25.0 |  |
|  |  | CoFeB deposition | 50.0 |  |
|  |  | Mg deposition | 25.0 |  |
| 7 | Transfer chamber | Wafer Transfer | 10.0 | 10.0 |
| 8 | Oxidation chamber | Oxidation | 90.0 | 90.0 |
| 9 | Transfer chamber | Wafer Transfer | 10.0 | 10.0 |
| 10 | Sputtering deposition chamber C (4PVD) | CoFeB deposition | 50.0 | 295.0 |
|  |  | Ta deposition | 25.0 |  |
|  |  | Ru deposition | 70.0 |  |
|  |  | Ta deposition* | 150.0 |  |
| 11 | Transfer chamber | Wafer Transfer | 10.0 | 10.0 |
|  |  | Total time | 750.0 | 750.0 |

*co-sputtering
Throughput = 12.2

As shown in above Table 3, the takt time for the sputtering deposition chamber C is 295 seconds and the throughput is 12.2. Note that, also when the position of the process chamber is switched in the apparatus configuration diagram 1, the throughputs shown in Table 1 and Table 2 are maintained only if the sputtering targets are disposed so as to realize the sequential substrate 25 transfer.

(Second Embodiment)

The same effect can be obtained also when the sputtering deposition chamber for MgO film deposition in the first embodiment is replaced by a deposition chamber using a chemical vapor deposition method.

(Third Embodiment)

Figure 6:
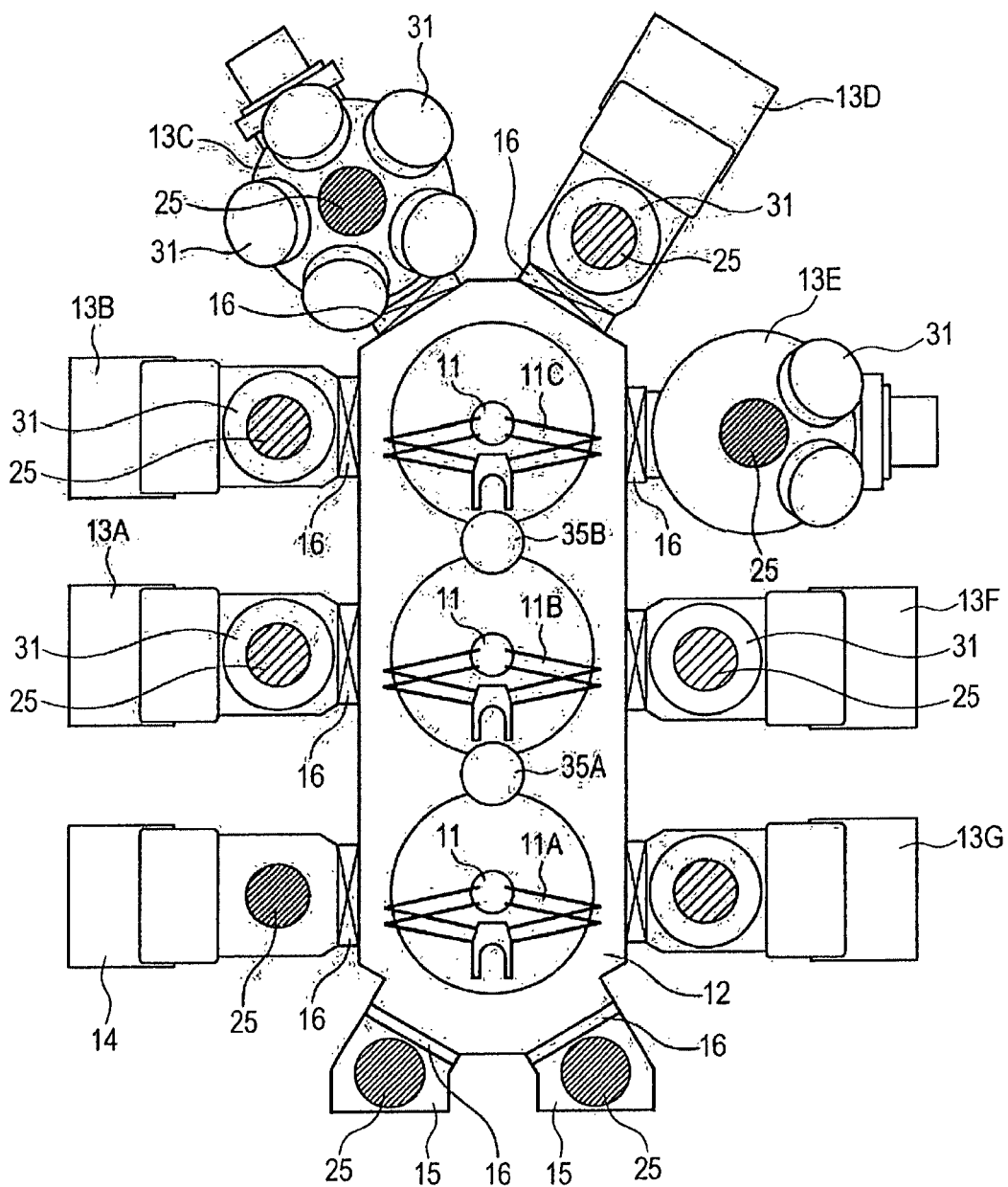
FIG. 6 is a configuration diagram showing a second example of a multi-layered thin film manufacturing apparatus according to an embodiment of the present invention.

FIG. 6 is a diagram showing a manufacturing apparatus according to another embodiment of the present invention which is applied for fabricating the tunnel magneto-resistance element shown in FIG. 5. To a transfer chamber 12 including three substrate transfer robots 11A, 11B and 11C as a substrate transfer mechanism, there are connected seven sputtering deposition chambers of reference numerals 13A to 13G, an etching chamber 14 for removing oxide and contamination on a substrate 25 surface by reverse sputtering etching, and two load lock chambers 15A and 15B. Among the sputtering deposition chambers 13A to 13G, the sputtering deposition chamber 13C includes five sputtering cathodes and the sputtering deposition chamber 13E includes two sputtering cathodes. On the other side, each of the sputtering deposition chambers 13A, 13B, 13D, 13F and 13G includes one sputtering cathode. A first sputtering deposition chamber including two or more cathodes (sputtering deposition chamber 13C or 13E) is used for forming the above magnetization fixing layer, the above magnetization free layer, or a partial layer (Ta layer 47) of the above protection layer. A second sputtering deposition chamber including one sputtering cathode (sputtering deposition chamber 13A, 13B, 13D, 13F or 13G) is used for forming the above foundation layer, the above anti-ferromagnetic layer, the above non-magnetic insulating layer and a layer other than the partial layer (Ta layer 50) of the above protection layer. A process chamber (etching chamber 14) is used for etching. Note that the first sputtering deposition chamber may include two or more targets made of the same material for performing co-sputtering.

A Ta target is attached to the sputtering deposition chamber 13A, a PtMn target is attached to the sputtering deposition chamber 13B, and a CoFe target, a Ru target, and two CoFeM targets 31 are attached to the sputtering deposition chamber 13C and the remaining one cathode is left vacant for backup. The two CoFeB targets 31 are used for the co-sputtering. An MgO target is attached to the sputtering deposition chamber 13D, a CoFeB target and a Ta target are attached to the sputtering deposition chamber 13E, and one Ta target is attached to each of the sputtering deposition chambers 13F and 13G.

A process time table in the present embodiment is shown in Table 4.

TABLE 4

| Process | Chamber | Event | Process time | [sec] Takt time |
|---|---|---|---|---|
| 1 | Transfer chamber 114 | Wafer Transfer | 10 | 10 |
| 2 | Second vacuum chamber 112 | Etching | 80 | 80 |
| 3 | Transfer chamber 114 | Wafer Transfer | 10 | 10 |
| 4 | First vacuum chamber 110 | Ta deposition | 40 | 40 |
| 5 | Transfer chamber 114 | Wafer Transfer | 10 | 10 |
| 6 | Second vacuum chamber 112 | PtMn deposition | 80 | 205 |
| 7 | Second vacuum chamber 112 | CoFe deposition | 25 | |
| 8 | Second vacuum chamber 112 | Ru deposition | 25 | |
| 9 | Second vacuum chamber 112 | CoFeB deposition | 50 | |
| 10 | Second vacuum chamber 112 | Mg deposition | 25 | |
| 11 | Transfer chamber 114 | Wafer Transfer | 10 | 10 |
| 12 | Process chamber | Oxidation | 90 | 90 |
| 13 | Transfer chamber 114 | Wafer Transfer | 10 | 10 |
| 14 | Second vacuum chamber 112 | CoFeB deposition | 50 | 50 |
| 15 | Transfer chamber 114 | Wafer Transfer | 10 | 10 |
| 16 | First vacuum chamber 110 | Ta deposition | 25 | 25 |
| 17 | Transfer chamber 114 | Wafer Transfer | 10 | 10 |
| 18 | Second vacuum chamber 112 | Ru deposition | 70 | 70 |
| 19 | Transfer chamber 114 | Wafer Transfer | 10 | 10 |
| 20 | First vacuum chamber 110 | Ta deposition | 150 | 150 |
| 21 | Transfer chamber 114 | Wafer Transfer | 10 | 10 |
| | Total time | | 800 | 800 |

Throughput = 8.8

Along the process time table of above Table 4, there will be explained a film forming sequence of the tunnel magneto-resistance element described in FIG. 5. An unprocessed substrate 25 is transferred into the etching chamber 14 from the load lock chamber 15A by the substrate transfer robot 11A (process 1 of Table 4), oxide and contamination on the substrate 25 surface are removed in the etching chamber 14 by reverse sputtering etching (process 2 of Table 4). Next, the Substrate 25 is placed on a placement stage 35A in the transfer chamber 12 by the substrate transfer robot 11A (process 3 of Table 4). Next, the substrate 25 is transferred into the sputtering deposition chamber 13A by the substrate transfer robot 11B and a Ta layer 41 is deposited over the substrate 25 having a film thickness of 20 nm as a foundation layer (process 4 of Table 4). Next, the substrate 25 is placed on a placement stage 35B in the transfer chamber 12 by the substrate transfer robot 11B (process 5 of Table 4). Next, a PtMn layer 42 is deposited over the substrate 25 having a film thickness of 15 nm as anti-ferromagnetic material by a sputtering method (process 6 of Table 4). Next, the substrate 25 is transferred into the sputtering deposition chamber 13C by the substrate transfer robot 11C (process 7 of Table 4), and a CoFeB layer 45 of ferromagnetic material and an MgO layer 46 of oxide are deposited over the substrate 25 in 3 nm and 1.2 nm, respectively, and a CoFeB layer 45 of ferromagnetic material is deposited having a film thickness of 3 nm by the co-sputtering method (process 8 of Table 4).

Next, the substrate 25 is transferred into the sputtering deposition chamber 13D by the substrate transfer robot 11C (process 9 of Table 4), and an MGO layer 46 of oxide is deposited over the substrate 25 in 1.2 nm by a sputtering method (process 10 of Table 4). Next, the substrate 25 is transferred into the sputtering deposition chamber 13E by the substrate transfer robot 11C (process 11 of Table 4), and a CoFeB layer 47 of ferromagnetic material is deposited again in 3 nm and a very thin Ta layer 48 is deposited thereover in 1.5 nm (process 12 of Table 4). Next, the substrate 25 is transferred into the sputtering deposition chamber 13F by the substrate transfer robot 11B (process 13 of Table 4), and a Ru layer 49 is deposited in 10 nm (process 14 of Table 4). Next, the substrate 25 is transferred into the sputtering deposition chamber 13G by the substrate transfer robot 11B (process 15 of Table 4), and a Ta layer 50 is deposited in 50 nm (process 16 of Table 4). Next, the substrate 25 is transferred into the load lock chamber 15B by the transfer robot 11A (process 17 of Table 4).

When the tunnel magneto-resistance element described in FIG. 5 is formed along the process time table of Table 5 in this manner, the takt time for each of the chambers is made further uniform and the takt time for the sputtering deposition chamber B which has the longest takt time is 100 seconds. Since the sequential substrate transfer is realized in the apparatus configuration shown in FIG. 6, the derived throughput is improved to 36 wafers/hour. Note that, also when the position of the process chamber is switched in the apparatus configuration diagram 6, the throughput shown in Table 4 is maintained only if the sputtering targets are disposed so as to realize the sequential substrate transfer.

FIRST COMPARATIVE EXAMPLE

As a first comparative example, there will be shown a time table in Table 5 when the tunnel magneto-resistance element described in FIG. 5 is formed by the use of the sputtering apparatus described in Patent Literature 4.

TABLE 5

| Process | Chamber | Event | Process time | [sec] Takt time |
|---|---|---|---|---|
| 1 | Transfer chamber 114 | Wafer Transfer | 10 | 10 |
| 2 | Second vacuum chamber 112 | Etching | 80 | 80 |
| 3 | Transfer chamber 114 | Wafer Transfer | 10 | 10 |
| 4 | First vacuum chamber 110 | Ta deposition | 40 | 40 |
| 5 | Transfer chamber 114 | Wafer Transfer | 10 | 10 |
| 6 | Second vacuum chamber 112 | PtMn deposition | 80 | 205 |
| 7 | Second vacuum chamber 112 | CoFe deposition | 25 | |
| 8 | Second vacuum chamber 112 | Ru deposition | 25 | |
| 9 | Second vacuum chamber 112 | CoFeB deposition | 50 | |
| 10 | Second vacuum chamber 112 | Mg deposition | 25 | |
| 11 | Transfer chamber 114 | Wafer Transfer | 10 | 10 |
| 12 | Process chamber | Oxidation | 90 | 90 |
| 13 | Transfer chamber 114 | Wafer Transfer | 10 | 10 |
| 14 | Second vacuum chamber 112 | CoFeB deposition | 50 | 50 |
| 15 | Transfer chamber 114 | Wafer Transfer | 10 | 10 |
| 16 | First vacuum chamber 110 | Ta deposition | 25 | 25 |
| 17 | Transfer chamber 114 | Wafer Transfer | 10 | 10 |
| 18 | Second vacuum chamber 112 | Ru deposition | 70 | 70 |
| 19 | Transfer chamber 114 | Wafer Transfer | 10 | 10 |

TABLE 5-continued

| Process | Chamber | Event | Process time | Takt time [sec] |
|---|---|---|---|---|
| 20 | First vacuum chamber 110 | Ta deposition | 150 | 150 |
| 21 | Transfer chamber 114 | Wafer Transfer | 10 | 10 |
| | | Total time | 800 | 800 |

Throughput = 8.8

Originally, in the sputtering deposition chamber described in Patent Literature 4, only one target material (Ta) is disposed in the first vacuum chamber 110. Accordingly, when the tunnel magneto-resistance element described in FIG. 5 is tried to be formed by the use of a sputtering apparatus of the sputtering apparatus described in Patent Literature 4, the layers other than the Ta layer need to be deposited by the vacuum chamber 112. Further, the sputtering apparatus described in Patent Literature 4 does not include a process chamber which performs a process other than sputtering, and therefore cannot perform process of above Table 5 (oxidation process). Accordingly, above Table 5 assumes a case that the tunnel magneto-resistance element described in FIG. 5 is formed by the manufacturing apparatus of FIG. 1 in which a process chamber is provided for the sputtering apparatus described in Patent Literature 4. The takt time of the sputtering apparatus described in Patent Literature 4 (total time for the second vacuum chamber 112 in the case of Patent Literature 4) is 405 seconds and the throughput is 8.8 (wafers/hour). Clearly this throughput is considerably worse than that of the apparatus configuration of FIG. 1 according to an embodiment of the present invention. Further, in the case of the sputtering apparatus described in Patent Literature 4, a substrate is transferred twice into the same process chamber in a series of the film deposition processes and therefore so-called sequential substrate transfer cannot be realized.

SECOND COMPARATIVE EXAMPLE

As a second comparative example, there will be shown a process time table in Table 6 when the tunnel magneto-resistance element described in FIG. 5 is formed by the use of the sputtering apparatus described in Patent Literature 5.

A process time table for the sputtering apparatus described in Patent Literature 5 is shown in Table 6.

TABLE 6

| Process | Chamber | Event | Process time | Takt time [sec] |
|---|---|---|---|---|
| 1 | Transfer chamber | Wafer Transfer | 10.0 | 10.0 |
| 2 | Etching chamber | Etching | 80.0 | 80.0 |
| 3 | Transfer chamber | Wafer Transfer | 10.0 | 10.0 |
| 4 | First single target DC magnetron sputtering module | Ta deposition | 40.0 | 40.0 |
| 5 | Transfer chamber | Wafer Transfer | 10.0 | 10.0 |
| 6 | Multi-target DC sputtering module | PtMn deposition | 80.0 | 180.0 |
| | | CoFe deposition | 25.0 | |
| | | Ru deposition | 25.0 | |
| | | CoFeB deposition | 50.0 | |
| 7 | Transfer chamber | Wafer Transfer | 10.0 | 10.0 |
| 8 | Multi-target ion beam sputtering module | MgO deposition | 300.0 | 445.0 |
| | | CoFeB deposition | 50.0 | |
| | | Ta deposition | 25.0 | |
| | | Ru deposition | 70.0 | |
| 9 | Transfer chamber | Wafer Transfer | 10.0 | 10.0 |

TABLE 6-continued

| Process | Chamber | Event | Process time | Takt time [sec] |
|---|---|---|---|---|
| 10 | Second single target DC magnetron sputtering module | Ta deposition | 100.0 | 100.0 |
| 11 | Transfer chamber | Wafer Transfer | 10.0 | 10.0 |
| | | Total time | 905.0 | 905.0 |

Throughput = 8.1

Originally, the sputtering system 600 disclosed in Patent Literature 5 does not include a process chamber which performs a process other than sputtering, and therefore cannot perform oxidation process. Further, for realizing so-called sequential substrate transfer by the use of the sputtering system 600 disclosed in Patent Literature 5, all the film depositions of MgO to CoFeM, Ta, and Ru in above Table 6 need to be performed by the multi-target ion-beam sputtering module 608. In this case, in addition to the MgO film deposition which requires long time because of a low sputtering rate, three metal layers are deposited in the same chamber, and therefore the takt time becomes 445.0 seconds and the throughput becomes 8.1 wafers/hour. Further, deposition of oxide and metal in the same chamber causes oxygen contamination in the metal layer and causes a so-called cross contamination problem which degrades film characteristics. Accordingly, also by the use of the sputtering system 600 disclosed in Patent Literature 5, it is not possible to realize so-called sequential substrate transfer and to improve throughput.

The invention claimed is:

1. A manufacturing method of growing a multi-layered film as a magneto-resistance element including:
    a first film that includes a metal film having a thickness not smaller than 10 nm;
    a second film that includes a metal film having a thickness not smaller than 10 nm;
    a third film that includes at least one layer of an oxide film, a nitride film, and a semiconductor film deposited between the first film and the second film;
    a magnetization fixing layer including a plurality of films; and
    a magnetization free layer,
    the method comprising:
    forming the first film in a first sputtering deposition chamber including one sputtering cathode;
    forming the second film in a second sputtering deposition chamber including one sputtering cathode;
    forming the third film in a third sputtering deposition chamber including one sputtering cathode;
    depositing at least the magnetization fixing layer in a fourth sputtering deposition chamber including two or more sputtering cathodes; and
    forming a plurality of films including the magnetization free layer in a fifth sputtering deposition chamber including two or more sputtering cathodes,
    wherein each of the sputtering cathodes in the first sputtering deposition chamber, the second sputtering deposition chamber, and the third sputtering deposition chamber is larger than each of the sputtering cathodes in the fourth sputtering deposition chamber and the fifth sputtering deposition chamber.

2. A manufacturing method of growing a multi-layered film as a magneto-resistance element over a substrate, wherein the multi-layered film includes:
- a first film that includes a metal film having a thickness larger in a different order of magnitude than the thinnest film in the multi-layered film;
- a second film that includes a metal film having a thickness larger in a different order of magnitude than the thinnest film;
- a third film that includes at least one layer of an oxide film, a nitride film, and a semiconductor film;
- a magnetization fixing layer including a plurality of films; and
- a magnetization free layer, the method comprising:
- forming the first film in a first sputtering deposition chamber including one sputtering cathode;
- forming the second film in a second sputtering deposition chamber including one sputtering cathode;
- forming the third film in a third sputtering deposition chamber including one sputtering cathode;
- depositing at least the magnetization fixing layer in a fourth sputtering deposition chamber including two or more sputtering cathodes; and
- forming a plurality of films including the magnetization free layer in a fifth sputtering deposition chamber including two or more sputtering cathodes, wherein each of the sputtering cathodes in the first sputtering deposition chamber, the second sputtering deposition chamber, and the third sputtering deposition chamber is larger than each of the sputtering cathodes in the fourth sputtering deposition chamber and the fifth sputtering deposition chamber.

* * * * *